US006268765B1

(12) United States Patent
Gopinathan et al.

(10) Patent No.: US 6,268,765 B1
(45) Date of Patent: Jul. 31, 2001

(54) 2.5V, 30-100 MHZ 7TH ORDER EQUIRIPPLE DELAY CONTINUOUS-TIME FILTER AND VARIABLE GAIN AMPLIFIER

(75) Inventors: Venugopal Gopinathan, Irving, CA (US); Maurice Tarsia, Colonia, NJ (US); Davy H. Choi, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/211,658

(22) Filed: Dec. 15, 1998

Related U.S. Application Data
(60) Provisional application No. 60/069,475, filed on Dec. 15, 1997.

(51) Int. Cl.$^7$ ........................................................ H03K 5/00

(52) U.S. Cl. .......................... 327/553; 327/558; 327/336; 327/103; 327/355; 330/306

(58) Field of Search ...................................... 327/103, 552, 327/553, 336, 558, 554, 555, 556, 557, 559, 355, 361; 330/306

(56) References Cited

U.S. PATENT DOCUMENTS

| 5,491,604 | * | 2/1996 | Nguyen et al. | ........................ 331/154 |
| 5,508,570 | * | 4/1996 | Laber et al. | ........................... 327/553 |
| 5,625,317 | * | 4/1997 | Deveirman | ........................... 327/553 |

OTHER PUBLICATIONS

"A 4–MHz CMOS Continuous–Time Filter with On–Chip Automatic Tuning", Krummenacher, et. al., *IEEE Journal of Solid–State Circuits*, vol. 23, No. 3, Jun. 1988, pp. 750–758.

"A 20–MHz Sixth–Order BiCMOS Parasite–Insensitive Continuous–Time Filter and Second–Order Equalizer Optimized for Disk–Drive Read Channels", Laber, et. al., *IEEE Journal of Solid–State Circuit*, vol. 28, No. 4, Apr. 1993, pp. 462–470.

"A 20MHz 6$^{th}$ Order BiCMOS Programmable Filter Using Parasitic–Insensitive Integrators", Laber, et. al., Digest of Technical Papers, Int. Symp. On VLSI Circuits, Paper 7–D.3, pp. 104–105, 1992.

An All–Digital Phase–Locked Loop with 50–Cycle Lock Time Suitable for High–Performance Microprocessors, Jim Dunning, et. al., *IEEE Journal of Solid–State Circuits*, vol. 30, No. 4, Apr. 1995, pp. 412–422.

"Design Considerations for High–Frequency Continuous–Time Filters and Implementation of an Antialiasing Filter for Digital Video", Gopinathan, et. al., *IEEE Journal of Solid–State Circuits*, vol. 25, No. 6, Dec. 1990, pp. 1368–1378.

"Fully Differential Operational Amplifiers with Accurate Output Balancing", Banu, et. al., *IEEE Journal of Solid–State Circuits*, vol. 23, No. 6, Dec. 1988, pp. 1410–1414.

(List continued on next page.)

*Primary Examiner*—Dinh T. Le
(74) *Attorney, Agent, or Firm*—Robert N. Rountree; Frederick J. Telecky, Jr.

(57) ABSTRACT

A circuit is designed with a first transconductor circuit (903) with a first input terminal (901) coupled to receive a voltage signal, a second input terminal (1017) coupled to receive a control signal and an output terminal. The first transconductor circuit has a gain responsive to the control signal. A first integrator circuit (905) has an input terminal coupled to the first transconductor circuit output terminal and has an output terminal. A second transconductor circuit (909) has an input terminal coupled to the first integrator circuit output terminal and an output terminal. A second integrator circuit (911) has an input terminal coupled to the second transconductor circuit output terminal and has an output terminal.

20 Claims, 9 Drawing Sheets

WEIGHTED SUMMATION
USING DIGITALLY CONTROLLED
RESISTOR ARRAYS

OTHER PUBLICATIONS

"Good-bye PRML, hello DFE: Adaptive read channel debuts", Dakshinamurthy, et. al., Electronics, Data Storage, Mar. 1996, 4 pages.

"Monolithic 10–30 MHz Tunable Bipolar Bessel Lowpass Filter", Vierman, et. al., IEEE Proc. ISCAS, Paper 7–D.2, pp. 521–524.

* cited by examiner

| VARIABLE-GAIN AMPLIFIER | |
|---|---|
| -3dB BANDWIDTH | 360MHZ |
| PEAK GAIN | 23dbB |
| WORST-CASE DISTORSION (THD) | 1% AT 200MVP-P |
| 7TH ORDER EQUIRIPPLE DELAY LOWPASS FILTER | |
| -3dB BANDWIDTH | 30MHZ TO 100MHZ |
| BANDWIDTH ACCURACY | ±10% |
| GROUP-DELAY ACCURACY | ±5% |
| BOOST RANGE | 0dB TO 12dB |
| WORST-CASE DISTORSION (THD) | 1% AT 200mVP-P |

*FIG. 4A*

| 7TH ORDER EQUIRIPPLE DELAY LOWPASS FILTER (CORNER AT 100MHZ) | | |
|---|---|---|
| BIQUAD NUMBER | RESONANCE FREQUENCY | Q |
| BIQUAD #1 | 114.7MHZ | 0.68 |
| BIQUAD #2 | 171.8MHZ | 1.114 |
| BIQUAD #3 | 231.7MHZ | 2.02 |
| FIRST ORDER SECTION | 86.13MHZ | M/A |

*FIG. 4B*

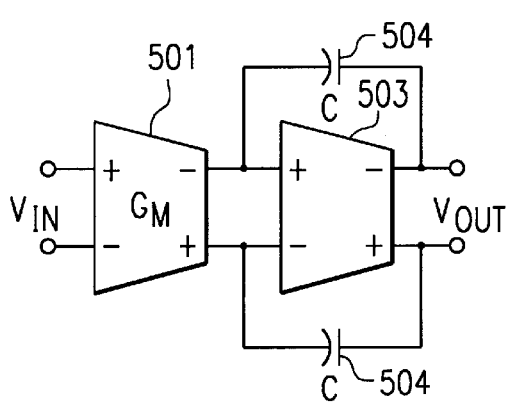

*FIG. 5A*
*(PRIOR ART)*

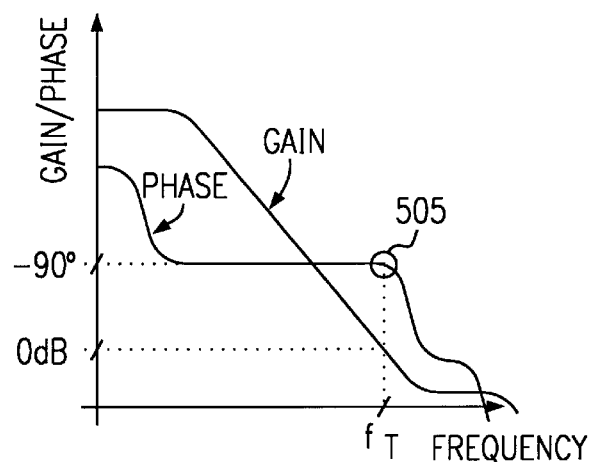

*FIG. 5B*
*(PRIOR ART)*

WEIGHTED SUMMATION
USING DIGITALLY CONTROLLED
RESISTOR ARRAYS

2.5V, 30-100 MHZ 7$^{TH}$ ORDER EQUIRIPPLE DELAY CONTINUOUS-TIME FILTER AND VARIABLE GAIN AMPLIFIER

CLAIM TO PRIORITY OF PROVISIONAL APPLICATION

This application claims priority under 35 U.S.C. §119(e)(1) of provisional application No. 60/069,475, filed Dec. 15, 1997.

FIELD OF THE INVENTION

This invention relates to an integrated circuit and more particularly to an integrated circuit with a continuous-time filter and variable gain amplifier.

BACKGROUND OF THE INVENTION

Present computer systems typically use hard-disk drive systems for mass storage. An exemplary hard disk drive read channel of the prior art is shown at FIG. 1. A magnetic surface of the hard disk 101 induces electrical signals in the read head 103. The data rate of these signals varies with each zone of the hard disk drive. These read signals are amplified by preamplifier circuit 105 and applied to variable gain amplifier 109 and programmable analog filter 111 of the read channel analog front end 107. The programmable filter performs anti-aliasing and channel equalization for analog-to-digital (ADC) circuit 113. This ADC circuit subsequently produces digital signals suitable for digital processor 115.

Conventional design techniques may not be adequate for state-of-the-art read channel applications for several reasons. First, a native tolerance of resistor-capacitor (RC) products is typically ±40%. Such variation is incompatible with a required filter group delay accuracy of ±5% at a high corner frequency of 100 MHz. Second, variable gain amplifier (VGA) gain and bandwidth requirements for conventional techniques may require a relatively large unity-gain bandwidth of 5.85 GHz. Finally, conventional attempts to avoid gain-bandwidth limitations may result in an increase in power dissipation.

SUMMARY OF THE INVENTION

These problems are resolved by a circuit comprising a first transconductor circuit with a first input terminal coupled to receive a voltage signal, a second input terminal coupled to receive a control signal and an output terminal. The first transconductor circuit has a gain responsive to the control signal. A first integrator circuit has an input terminal coupled to the first transconductor circuit output terminal and an output terminal. A second transconductor circuit has an input terminal coupled to the first integrator circuit output terminal and an output terminal. A second integrator circuit has an input terminal coupled to the second transconductor circuit output terminal and has an output terminal.

The present invention avoids conventional gain-bandwidth limitations by incorporating a variable gain amplifier within a cascade filter.

BRIEF DESCRIPTION OF THE DRAWINGS

A more complete understanding of the invention may be gained by reading the subsequent detailed description with reference to the drawings wherein:

FIG. 4A is a specification for the VGA and 7$^{th}$ order equiripple delay low-pass filter of the present invention FIG. 4B is a specification for each section of the 7$^{th}$ order equiripple delay low-pass filter of the present inventions, FIG. 5A is a schematic diagram of an integrator circuit of the prior art;

FIG. 5B is a gain/phase diagram of the integrator circuit of FIG. 5A;

DETAILED DESCRIPTION OF THE PREFERRED EMBODIMENTS

Figure 1:
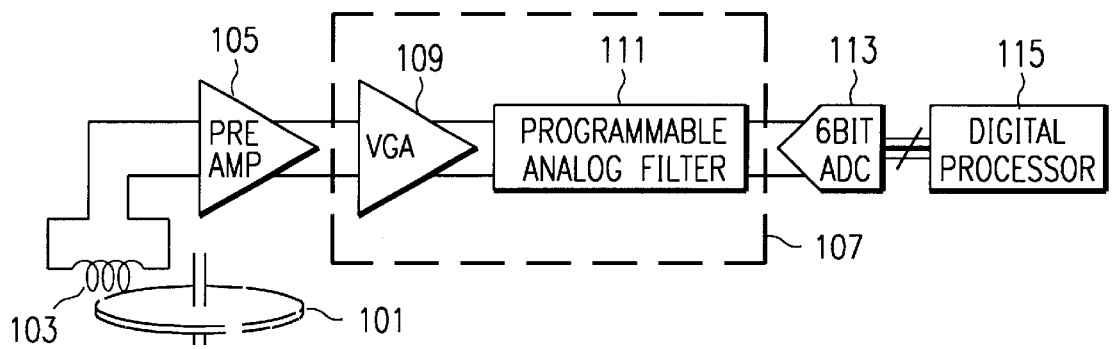
FIG. 1 is a block diagram of a typical hard-disk drive read channel of the prior art.
Figure 2:
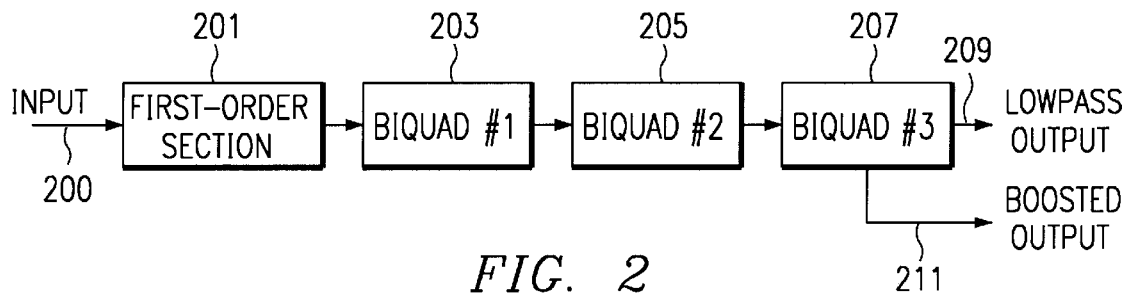
FIG. 2 is a block diagram of a filter circuit of the present invention.
Figure 3A:
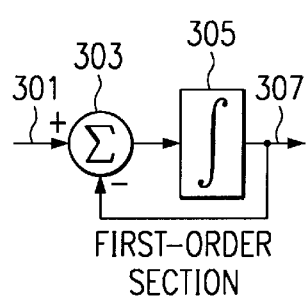
FIG. 3A is a block diagram of a first section of the filter circuit of FIG. 2.
Figure 3B:
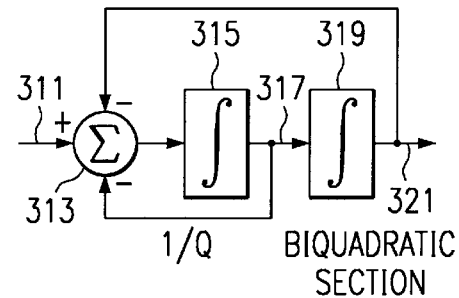
FIG. 3B is a block diagram of the second and following sections of the filter circuit of FIG. 2.

A block diagram of an integrated variable gain amplifier and 7$^{th}$ order filter of the present invention as shown in FIG. 2 will be described in detail. First order section 201 as shown in FIG. 3A receives an input signal on lead 301 that is summed with a feedback signal from output lead 307 and applied to integrator circuit 305. The output signal on lead 307 is applied to biquadratic circuits 203, 205 and 207 connected in cascade. Each biquadratic circuit (FIG. 3B) includes series connected integrator circuits 315 and 319 with respective feedback signals applied to summation terminal 313. The final biquadratic circuit 207 produces a boosted output signal of the present invention on lead 211 as will be described in detail. A specification for the VGA and 7$^{th}$ order equiripple delay low-pass filter of the present invention is given at FIG. 4A. In particular, the filter specification requires a −3 dB bandwidth from 30 MHz to 100 MHz and a boost range from 0 dB to 12 dB. A respective resonant frequency and Q for each section of the 7$^{th}$ order equiripple delay low-pass filter of the present invention is given at FIG. 4B.

Referring now to FIG. 5A, there is a schematic diagram of an integrator circuit of the prior art with a corresponding gain/phase diagram at FIG. 5B. The circuit includes transconductor circuit 501 connected in series with operational amplifier 503. Feedback capacitors 504 produce a right half-plane zero in the closed loop transfer function that may lead to an abrupt phase change 505 at a unity gain frequency $f_T$. This abrupt phase change will lead to significant phase errors in view of typical ±40% variation of RC time constants and operating conditions.

Figure 6A:
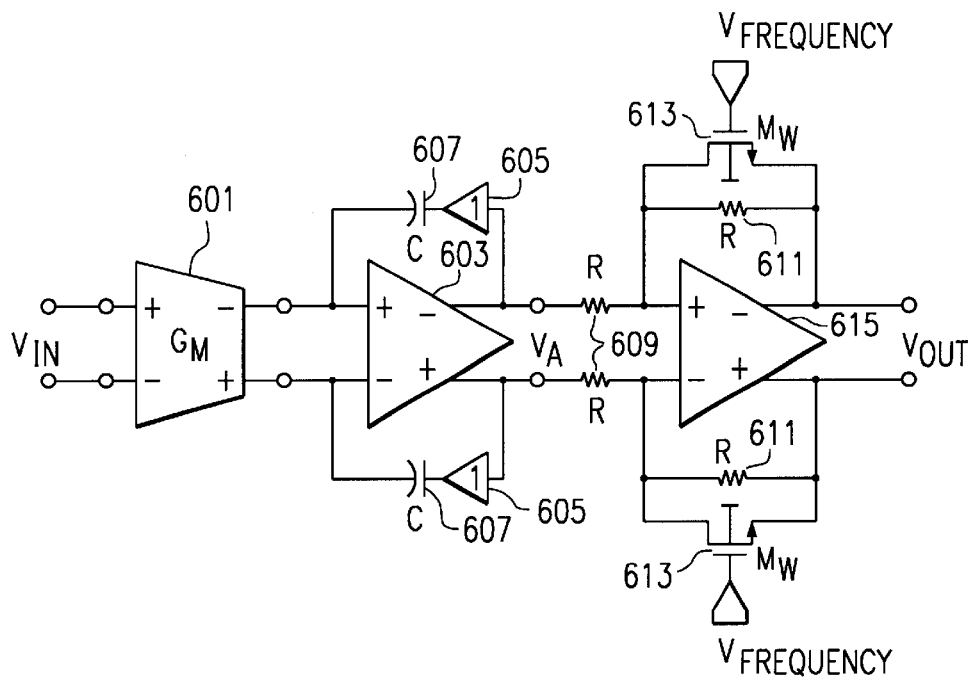
FIG. 6A is a schematic diagram of a biquadratic circuit of the present invention.
Figure 6B:
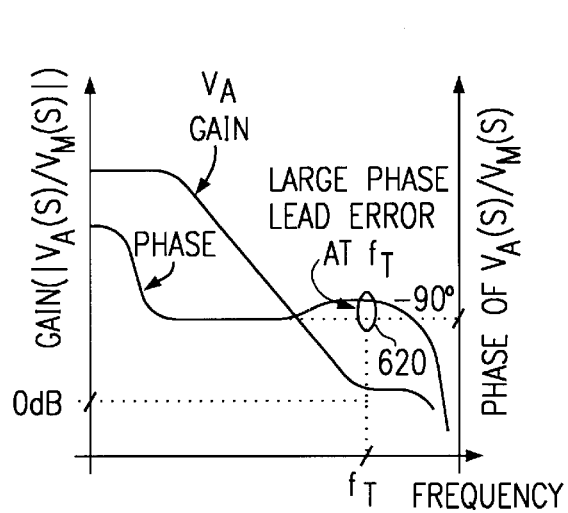
FIG. 6B is a gain/phase diagram of the signal $V_A$ of FIG. 6A.
Figure 6C:
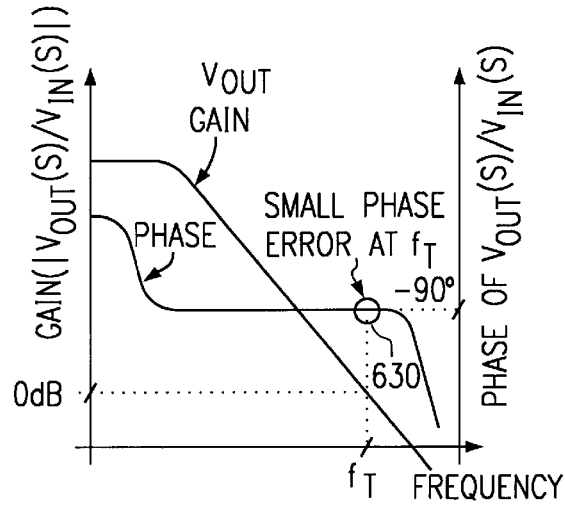
FIG. 6C is a gain/phase diagram of the signal $V_{OUT}$ of FIG. 6A.
Figure 7:
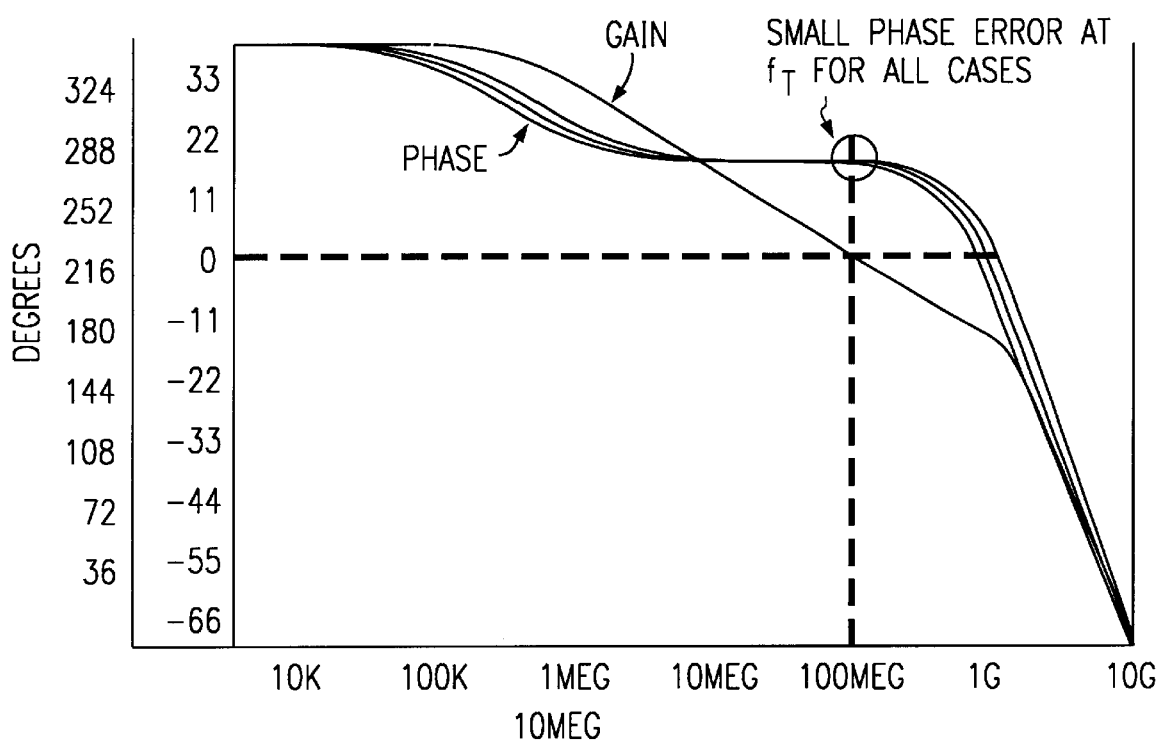
FIG. 7 is a simulation of the biquadratic circuit of FIG. 6A.

Turning now to FIG. 6A, there is a schematic diagram of a biquadratic circuit of the present invention. The biquadratic circuit includes transconductor circuit 601 connected in series with operational amplifier 603. The feedback path through capacitors 607 is made unidirectional by coupling input terminals of source follower circuits 605 to the operational amplifier output terminals and coupling the source follower output terminals to the capacitors. This arrangement usually over compensates the right half-plane zero by moving it into the left half-plane and produces a large phase error lead 620 at unity gain frequency $f_T$ as shown in FIG. 6B. A trimming circuit including input resistors 609, feedback resistors 611, feedback transistors 613 and operational amplifier 615 is connected to the output terminals of the integrator circuit. This trimming circuit has a typical gain of unity. Application of control signal $V_{freq}$ modulates the conductivity of transistors 613, thereby providing a variable shunt for the feedback resistors and producing an automatic compensation for process and operating conditions. This control signal $V_{freq}$ is preferably developed by a servo-loop that constrains the filter conductance with an external trimming resistor. The resulting gain and phase diagram of FIG. 6C shows that the integrator of FIG. 6A has a nearly ideal phase of −90° at the unity gain frequency $f_T$ (630). A simulation in FIG. 7 of the biquadratic circuit of FIG. 6A shows the effectiveness of the biquadratic circuit in producing a small phase error at the unity gain frequency $f_T$ of 100 MHz for typical process variations. This is highly advantageous in eliminating significant phase errors of the prior art.

Figure 8B:
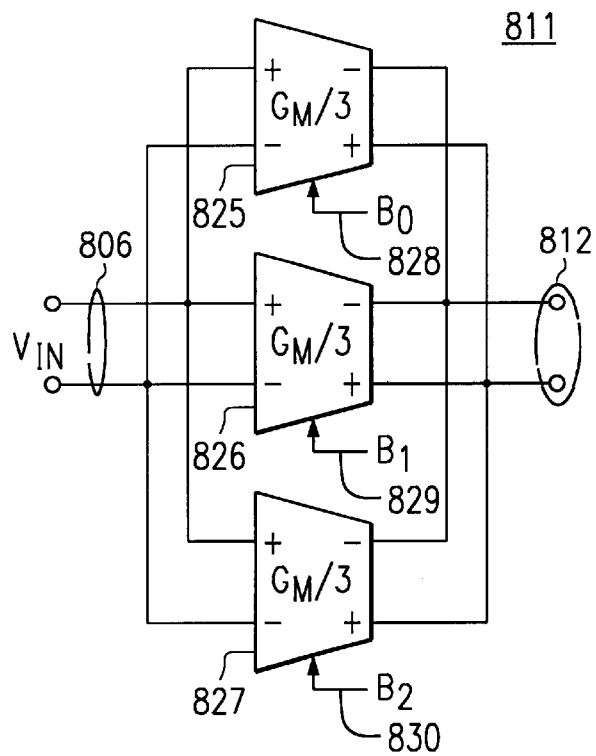
FIG. 8B is a schematic diagram of transconductor circuit 811 of the integrator circuit 319 of FIG. 8A.
Figure 8A:
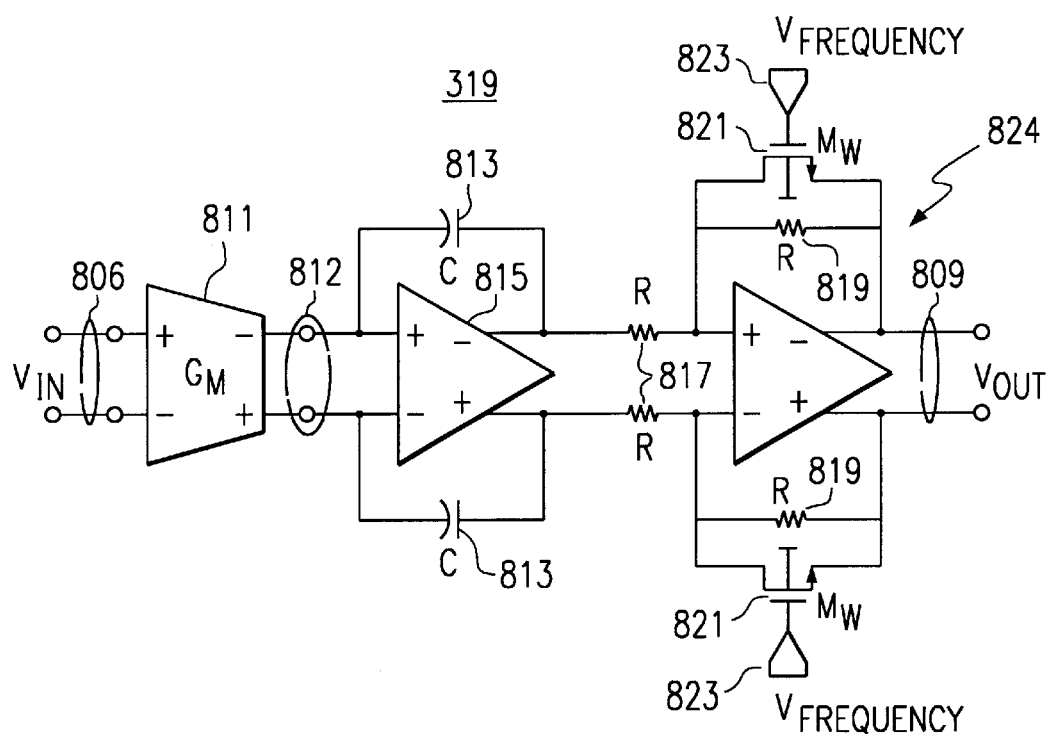
FIG. 8A is a schematic diagram of integrator circuit 319 of the biquadratic circuit of FIG. 3B.

Referring now to FIG. 8A–FIG. 8B, another embodiment of the biquadratic circuit of the filter circuit of FIG. 2 will be described in detail. The filter specification of FIG. 4A of the present invention requires a −3 dB bandwidth from 30 MHz to 100 MHz as previously disclosed. This requires a programmability range of up to 333%. Taken together with the −40% tunability requirement to compensate for process, temperature and RC tolerance, this would require a variation in unity gain frequency $f_T$ of the integrators of about 8:1. Integrating capacitors at such high frequencies, however, are quite small. Moreover, inherent parasitic circuit capacitance becomes significant compared to the small integrating capacitance. A capacitor array based on such physical limitations is impractical, therefore, due to the size limitation of the capacitors as well as their relative size to parasitic capacitance of the circuit.

A solution to this problem is implemented in integrator 319 of the biquadratic circuit (FIG. 3B) as shown in detail in FIG. 8A. The integrator includes transconductor circuit 811 connected in cascade with an integrator including operational amplifier 815 and feedback capacitors 813. The output signal of the integrator is applied to the tunable-gain amplifier 824. A schematic diagram of transconductor circuit 811 of the integrator circuit 807 of FIG. 8B is shown at FIG. 8C. The transconductor circuit 811 is implemented as three separate transconductor circuits 825–827 connected in parallel. The transconductor circuits are preferably identical and require only one-third the area and power of a comparable single transconductor circuit. Each of these transconductor circuits 825–827 is selectively enabled by a respective control signal on leads 828–830. This arrangement provides a coarse 3:1 programmability over the frequency range of interest. This highly advantageous implementation overcomes the practical limitation of capacitor array programmability and conserves power.

Figure 9:
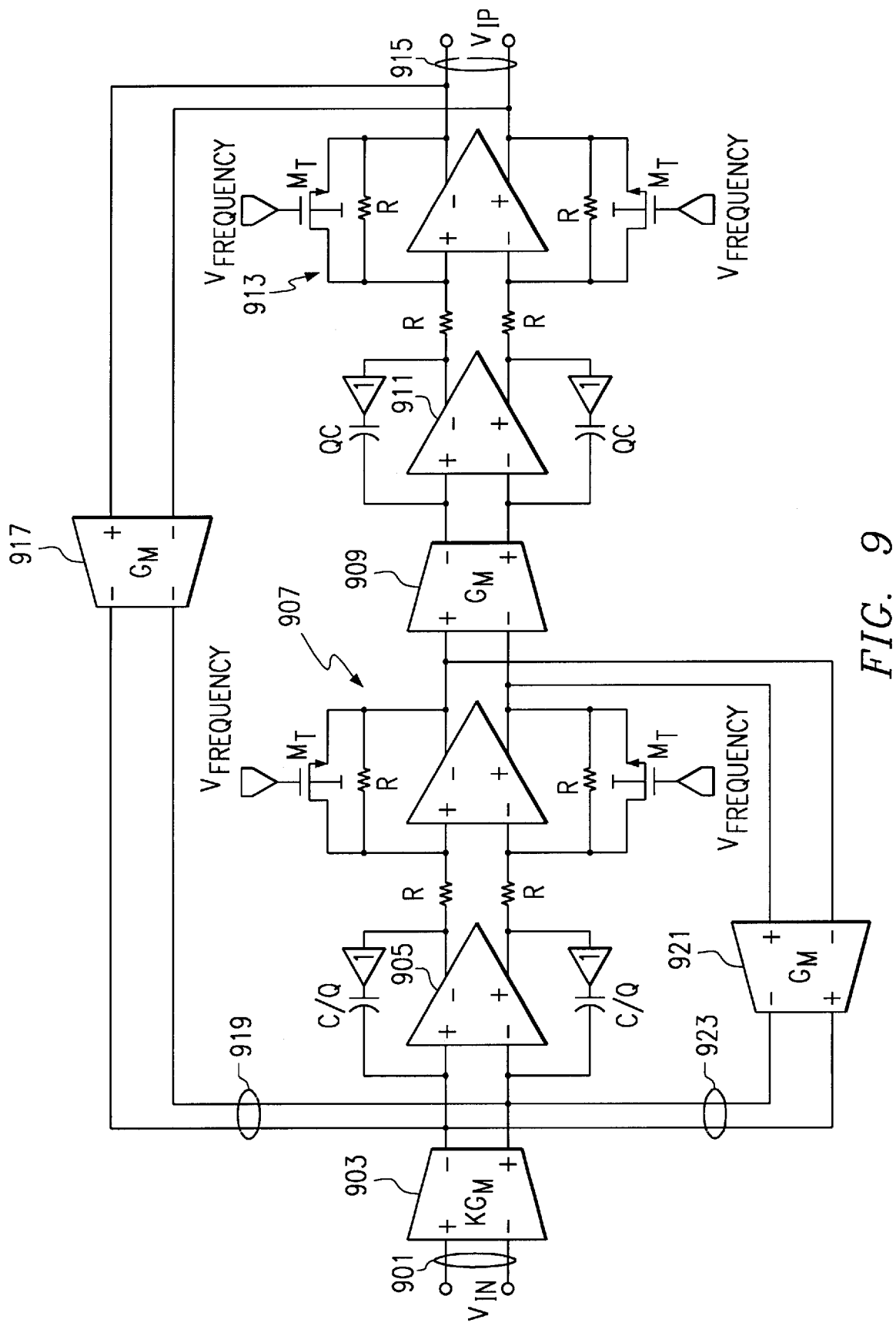
FIG. 9 is a detailed schematic diagram of biquadratic circuit 203 of the filter circuit of FIG. 2.

Turning now to FIG. 9, there is a detailed schematic diagram of biquadratic circuits 203 and 205 of the filter circuit of FIG. 2. The biquadratic circuit includes two integrator circuits in cascade. Each integrator circuit includes an input transconductor circuit (903, 909), an operational amplifier (905, 911) with capacitive feedback and a tunable-gain amplifier (907, 913). An output signal from first and second integrator circuits is fed back through transconductor circuits 921 and 917, respectively, to input terminals of the integrating operational amplifier circuit 905. A transfer function of the biquadratic circuit with parameters and component values of FIG. 9 is:

$$H_{lp}(s) = \frac{V_{lp}(s)}{V_{in}(s)} = \frac{K}{\left(\frac{s}{\omega_0}\right)^2 + \left(\frac{s}{\omega_0 Q}\right) + 1} \text{ where } \omega_0 = \frac{aG_m}{C}$$

Scaling the gain of input transconductor circuit 903 by a factor K, therefore, introduces the same scaling factor K in the overall transfer function without affecting the shape or group delay of the biquadratic circuit. This is highly advantageous for several reasons. First, the gain of the biquadratic circuit is not determined by conventional voltage-to-current-to-voltage conversion. Thus, it is not constrained by conventional cascade gain-bandwidth limitations. Second, this configuration consumes no additional power. Finally, the overall gain of the filter circuit may be distributed among the biquadratic circuits.

Figure 10:
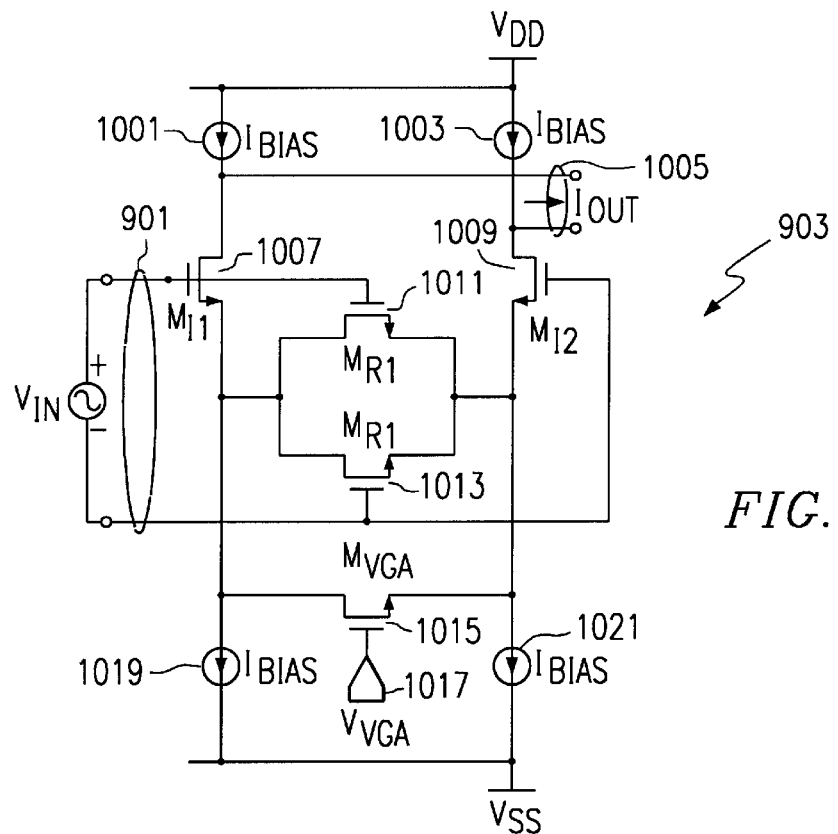
FIG. 10 is a schematic diagram of transconductor circuit 903 of the biquadratic circuit of FIG. 9.

The schematic diagram of FIG. 10 illustrates the operational principle of transconductor circuit 903 of the biquadratic circuit of FIG. 9. The transconductor circuit includes a first series circuit including a current source 1001, an input transistor 1007 and another current source 1019. A second series circuit includes current sources 1003 and 1021 and input transistor 1009. Shunt transistors 1011 and 1013 are coupled between the first and second series circuits and have control gate coupled to input transistors 1007 and 1009, respectively. A control transistor 1015 is connected in parallel with the shunt transistors. In operation, a difference voltage $V_{in}$ is applied to input leads 901. This difference voltage modulates the conductivity of respective input and shunt transistors, thereby steering a corresponding current through output terminals 1005. Application of control signal $V_{VGA}$ modulates the conductivity of control transistor 1015. This change in conductivity alters the current flow through output terminals 1005, thereby producing a variable gain.

Figure 11:
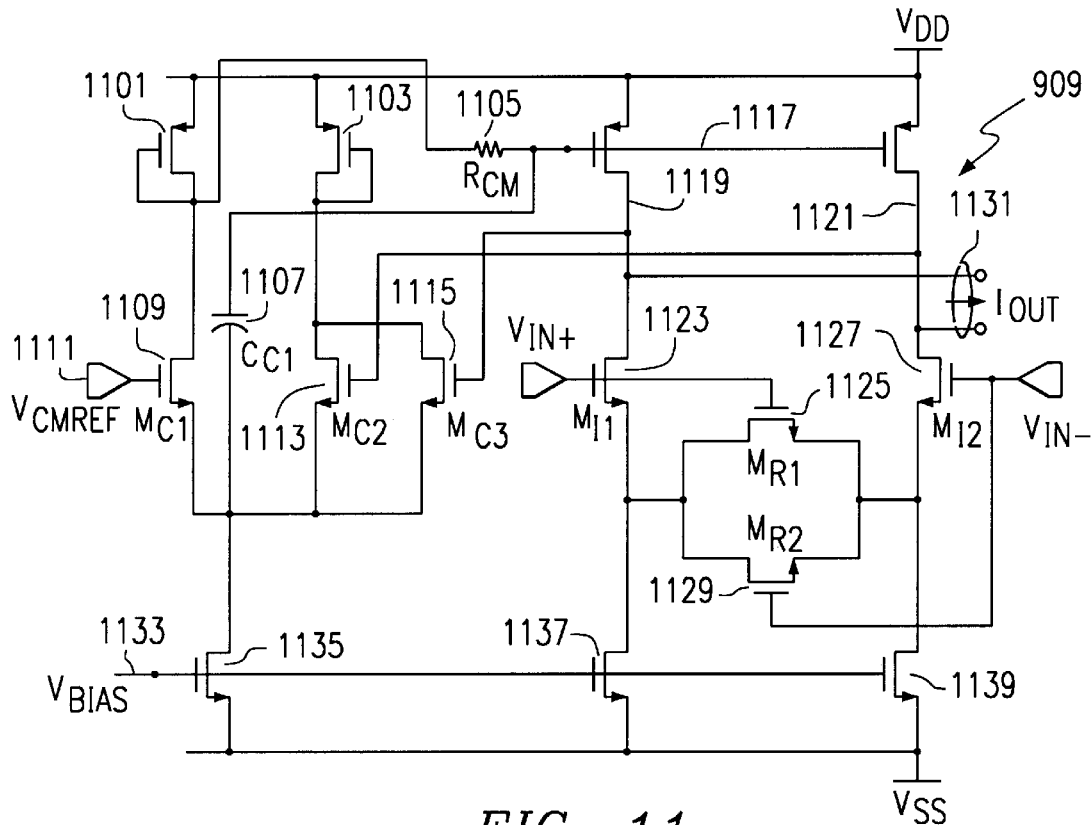
FIG. 11 is a detailed schematic diagram of transconductor circuit 909 of the biquadratic circuit of FIG. 9.

A detailed schematic diagram of transconductor circuit 909 of the biquadratic circuit of FIG. 9 is illustrated in FIG. 11. Transconductor circuit 909 operates in a manner similar to that previously described for transconductor circuit 903 of FIG. 10 with the exception of the variable gain feature. In operation, transconductor circuit 909 receives a difference voltage signal at input transistors 1123 and 1127 and produces a corresponding output current signal at terminals 1131. Output terminals 1119 and 1121 drive a common-mode feedback circuit including feedback transistors 1109, 1113 and 1115. A further high-frequency feedback path is provided through capacitor 1107 to obtain an adequate closed-loop bandwidth for the common-mode feedback loop. Resistor 1105 separates the low-frequency feedback path from the high-frequency feedback path to provide adequate phase margins. This feedback circuit is highly advantageous for providing a closed loop bandwidth of over 200 MHz with more than a 60° phase margin for worst case process variation.

Figure 12:
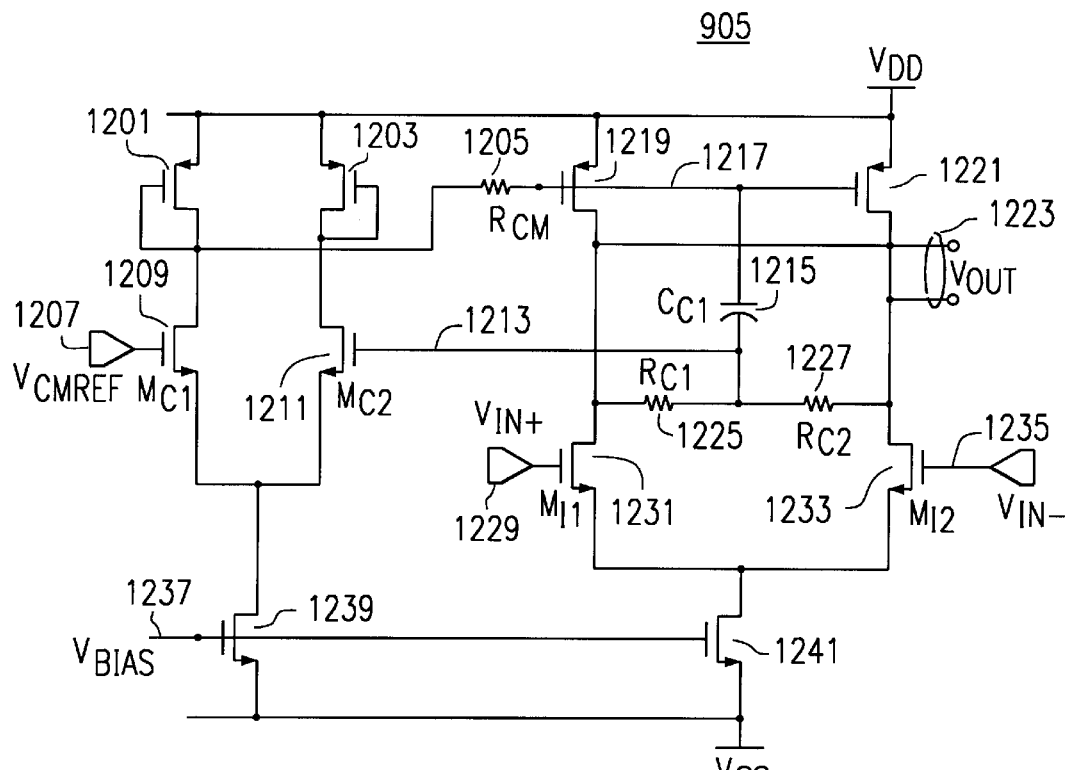
FIG. 12 is a detailed schematic diagram of the operational amplifier circuit of integrator circuit 905 of the biquadratic circuit of FIG. 9.
Figure 13:
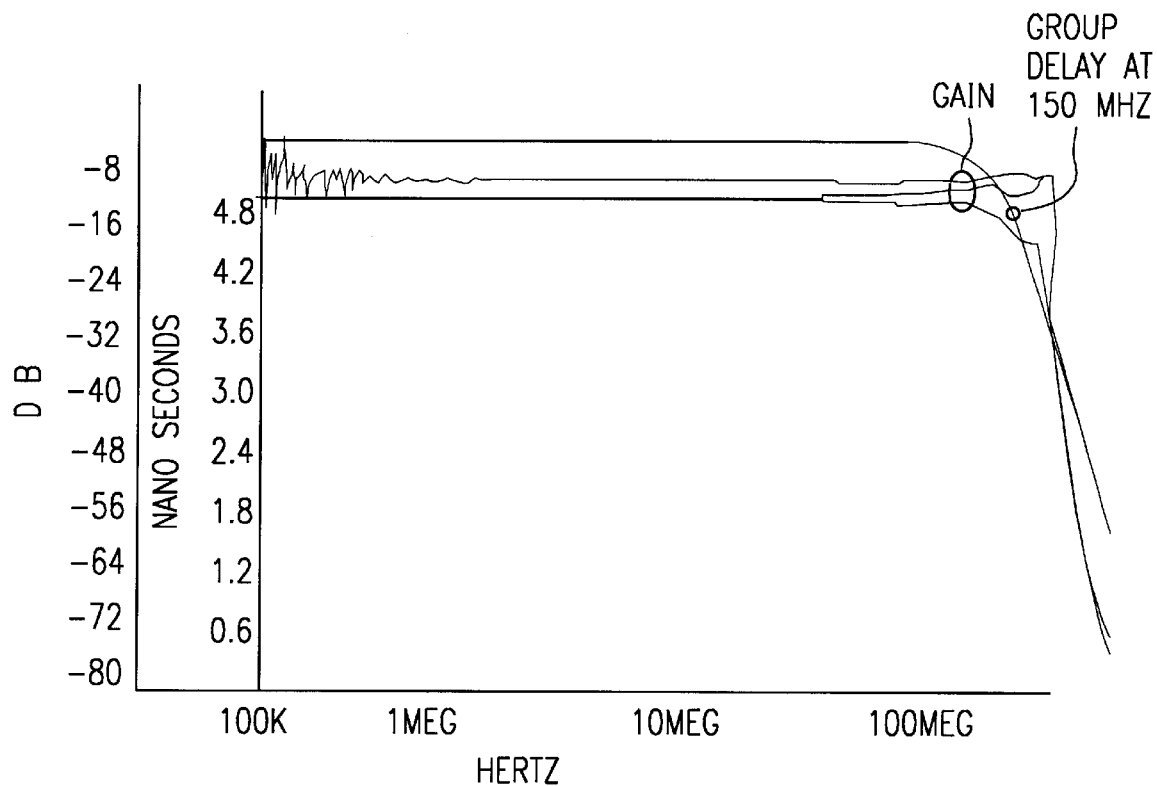
FIG.13 simulation of the gain and group delay of the filter circuit of FIG. 2.

Turning now to FIG. 12, there is a detailed schematic diagram of the operational amplifier circuit of integrator circuit 905 of the biquadratic circuit of FIG. 9. The operational amplifier circuit receives a differential voltage across input terminals 1229 and 1235 and produces a corresponding output voltage at terminals 1223. A low-frequency common-mode feedback circuit including transistors 1209 and 1211 is driven by a signal from a common terminal of a voltage divider formed by equal-valued resistors 1225 and 1227. A high-frequency common-mode feedback path is provided through capacitor 1215. The low-frequency and high-frequency feedback paths are separated by resistor 1205 to provide a closed loop bandwidth similar to that of the transconductor circuit of FIG. 11. A simulation of the gain and group delay of the filter circuit of FIG. 2 with process variation is shown in FIG. 13. The circuit has a −3 dB bandwidth set at 100 MHz. The group delay has a maximum variation of ±4% from 0–150 MHz.

Figure 14:
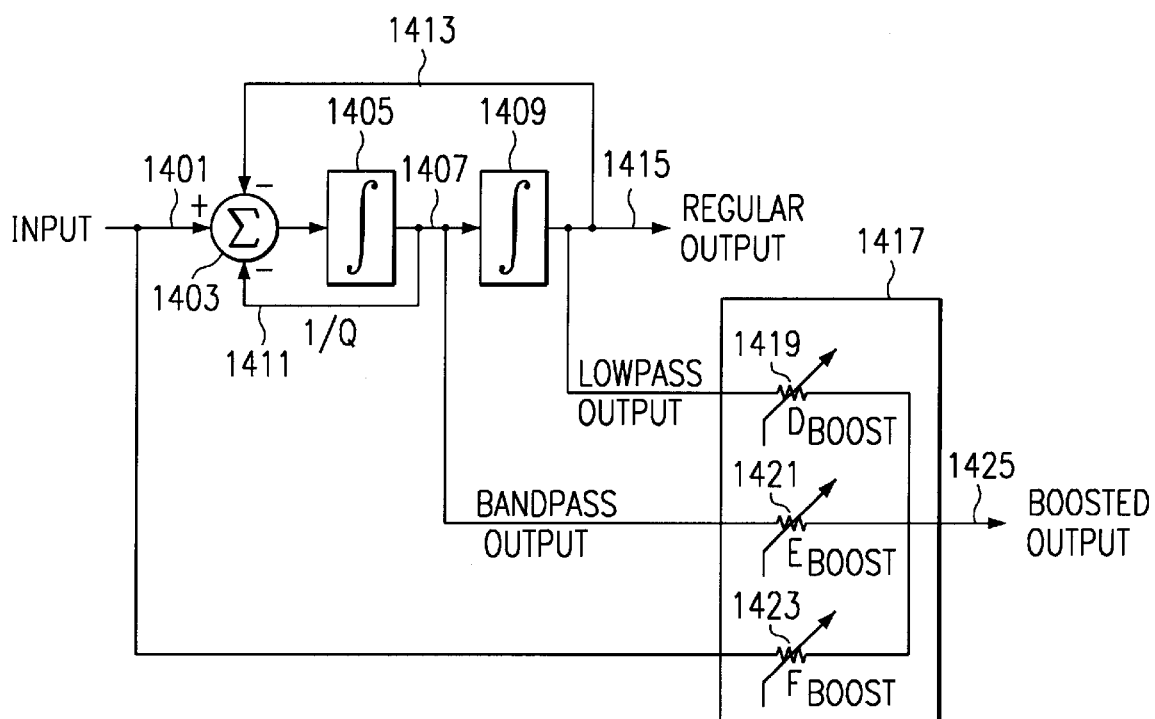
FIG. 14 is a schematic diagram of an embodiment of a boost circuit of the biquadratic circuit 207 of FIG. 2.

Referring now to FIG. 14, there is a schematic diagram of a novel embodiment of a boost circuit of the biquadratic circuit 207 of FIG. 2 as specified in FIG. 4A. This boost function is implemented for pulse slimming at high data rates by adding zeros to the low-pass filter transfer function. The overall transfer function to be implemented for the low-pass filter with boost is:

$$H_{lp-Boost}(s) = \frac{V_{Boost}(s)}{V_{in}(s)} = \frac{a\left(\frac{s}{\omega_0}\right)^2 + b\left(\frac{s}{\omega_0 Q}\right) + 1}{\left(\frac{s}{\omega_0}\right)^2 + \left(\frac{s}{\omega_0 Q}\right) + 1}$$

When expanded, the transfer function has the form:

$$H_{lp-Boost}(s) = a + (b-a)\frac{\left(\frac{s}{\omega_0 Q}\right)}{\left(\frac{s}{\omega_0}\right)^2 + \left(\frac{s}{\omega_0 Q}\right) + 1} + (1-a)\frac{1}{\left(\frac{s}{\omega_0}\right)^2 + \left(\frac{s}{\omega_0 Q}\right) + 1}$$

Programmable constants a and b are chosen so that a maximum boost increases the gain at the original −3 dB frequency by 12 dB. The first term of the expanded transfer function represents the input signal at lead 1401 scaled by a. The second term of the expanded transfer function represents the bandpass filter output signal at lead 1407 scaled by (b−a). The final term of the expanded transfer function represents the lowpass filter output signal at lead 1415 scaled by (1−a). These scale factors are implemented by the programmable resistive network including resistors 1419, 1421 and 1423 to produce the boosted output signal at lead 1425. This implementation of the boost function is highly advantageous, since it requires no additional signals to perform a weighted sum of existing signals.

Although the invention has been described in detail with reference to its preferred embodiment, it is to be understood that this description is by way of example only and is not to be construed in a limiting sense. It is to be further understood that numerous changes in the details of the embodiments of the invention will be apparent to persons of ordinary skill in the art having reference to this description. It is contemplated that such changes and additional embodiments are within the spirit and true scope of the invention as claimed below.

What is claimed:

1. A circuit, comprising:
    a first transconductor circuit having a first input terminal coupled to receive a voltage signal, having a second input terminal coupled to receive a control signal and having an output terminal, the first transconductor circuit having a gain responsive to the control signal;
    a first integrator circuit having an input terminal coupled to the first transconductor circuit output terminal and having an output terminal;
    a second transconductor circuit having an input terminal coupled to the first integrator circuit output terminal and having an output terminal; and
    a second integrator circuit having an input terminal coupled to the second transconductor circuit output terminal and having an output terminal,
    wherein one of the first and second integrator circuits further comprises:
    a source follower circuit having an input terminal coupled to a respective integrator circuit output terminal and having an output terminal; and
    a capacitor having a first terminal coupled to the respective integrator circuit input terminal and having a second terminal coupled to the respective source follower circuit output terminal.

2. A circuit, comprising:
    a first transconductor circuit having a first input terminal coupled to receive a voltage signal, having a second input terminal coupled to receive a control signal and having an output terminal, the first transconductor circuit having a gain responsive to the control signal;
    a first integrator circuit having an input terminal coupled to the first transconductor circuit output terminal and having an output terminal;
    a second transconductor circuit having an input terminal coupled to the first integrator circuit output terminal and having an output terminal;
    a second integrator circuit having an input terminal coupled to the second transconductor circuit output terminal and having an output terminal;
    an amplifier circuit having an input terminal and an output terminal, the output terminal coupled to the second transconductor circuit input terminal;
    an input resistor connected between the first integrator circuit output terminal and the amplifier circuit input terminal;
    a feedback resistor connected between the amplifier circuit input and output terminals; and
    a transistor having a current path connected between the amplifier circuit input and output terminals and having a control gate coupled to receive a control signal, wherein a conductivity of the transistor varies a gain of the amplifier circuit in response to the control signal.

3. A circuit as in claim 2, wherein the control signal applied to the gate of the transistor corresponds to a value of an external resistor.

4. A circuit, comprising:
    a first transconductor circuit having a first input terminal coupled to receive a voltage signal, having a second input terminal coupled to receive a control signal and having an output terminal, the first transconductor circuit having a gain responsive to the control signal;
    a first integrator circuit having an input terminal coupled to the first transconductor circuit output terminal and having an output terminal;
    a second transconductor circuit having an input terminal coupled to the first integrator circuit output terminal and having an output terminal;

a second integrator circuit having an input terminal coupled to the second transconductor circuit output terminal and having an output terminal;

an amplifier circuit having an input terminal and an output terminal;

an input resistor connected between the second integrator circuit output terminal and the amplifier circuit input terminal;

a feedback resistor connected between the amplifier circuit input and output terminals; and a transistor having a current path connected between the amplifier circuit input and output terminals and having a control gate coupled to receive a control signal, wherein a conductivity of the transistor varies a gain of the amplifier circuit in response to the control signal.

5. A circuit as in claim 4, wherein the control signal applied to the gate of the transistor corresponds to a value of an external resistor.

6. A circuit, comprising:

a first transconductor circuit having a first input terminal coupled to receive a voltage signal, having a second input terminal coupled to receive a control signal and having an output terminal, the first transconductor circuit having a gain responsive to the control signal;

a first integrator circuit having an input terminal coupled to the first transconductor circuit output terminal and having an output terminal;

a second transconductor circuit having an input terminal coupled to the first integrator circuit output terminal and having an output terminal; and a second integrator circuit having an input terminal coupled to the second transconductor circuit output terminal and having an output terminal, wherein the first transconductor circuit further comprises:

a first series circuit including a first current source, a first input transistor and a second current source;

a second series circuit including a third current source, a second input transistor and a fourth current source;

a first shunt transistor having a current path coupled between the first and second series circuits and having a control gate coupled to a control gate of the first input transistor;

a second shunt transistor having a current path coupled between the first and second series circuits and having a control gate coupled to a control gate of the second input transistor; and a control transistor having a current path coupled between the first and second series circuits and having a control gate coupled to receive the control signal.

7. A circuit, comprising:

a first integrator circuit having a first input terminal and a first output terminal;

a second integrator circuit having a second input terminal and a second output terminal, the second input terminal coupled to the first output terminal;

a first resistor circuit coupled between the first input terminal and a third output terminal;

a second resistor circuit coupled between the first output terminal and the third output terminal; and a third resistor circuit coupled between the second output terminal and the third output terminal.

8. A circuit as in claim 7, wherein at least one of the first, second and third resistor circuits further includes a control transistor coupled to the third output terminal, the control transistor having a current path for controlling current through said at least one of the first, second and third resistor circuits.

9. A circuit as in claim 7, wherein the first, second and third resistor circuits produce a weighted summation of signals from the first input terminal and the first and second output terminals at the third output terminal.

10. A circuit as in claim 7, wherein the first integrator circuit further comprises:

a first transconductor circuit coupled to the first input terminal and having an output terminal; and a first current integrator circuit having an input terminal coupled to the first transconductor circuit output terminal and having an output terminal coupled to the first output terminal.

11. A circuit as in claim 10, wherein the first and second output terminals are coupled by a first and second respective feedback paths to the first transconductor circuit output terminal.

12. A circuit as in claim 11, wherein each of the first and second respective feedback paths include a respective transconductor circuit.

13. A circuit as in claim 12, wherein the first transconductor circuit is further coupled to receive a control signal and wherein a gain of the first transconductor circuit is responsive to the control signal.

14. A circuit, comprising:

an integrator circuit having integrator input and output terminals and coupled to receive a voltage signal at the integrator input terminal;

a first biquadratic circuit having first input and output terminals, the first input terminal coupled to the integrator output terminal;

a second biquadratic circuit having second input and output terminals, the second input terminal coupled to the first output terminal; and a third biquadratic circuit having third input and output terminals, the third input terminal coupled to the second output terminal, wherein at least one of the first and second biquadratic circuits is further coupled to receive a gain control signal, the gain of the respective biquadratic circuit responsive to the gain control signal.

15. A circuit as in claim 14, wherein at least the other of the first and second biquadratic circuits is further coupled to receive another gain control signal, the gain of the respective biquadratic circuit responsive to said another gain control signal.

16. A circuit as in claim 14, wherein each of the first and second biquadratic circuits comprise:

a first transconductor circuit having a first input terminal coupled to receive a voltage signal, having a second input terminal coupled to receive the gain control signal and having an output terminal, the first transconductor circuit having a gain responsive to the control signal;

a first integrator circuit having an input terminal coupled to the first transconductor circuit output terminal and having an output terminal;

a second transconductor circuit having an input terminal coupled to the first integrator circuit output terminal and having an output terminal; and a second integrator circuit having an input terminal coupled to the second transconductor circuit output terminal and having an output terminal.

17. A circuit as in claim 14, wherein the third biquadratic circuit further comprises:

a first integrator circuit having a first input terminal and a first output terminal;

a second integrator circuit having a second input terminal and a second output terminal, the second input terminal coupled to the first output terminal;

a first resistor circuit coupled between the first input terminal and a third output terminal;

a second resistor circuit coupled between the first output terminal and the third output terminal; and a third resistor circuit coupled between the second output terminal and the third output terminal.

18. A circuit as in claim 14, wherein the third biquadratic circuit produces a lowpass output signal and a bandpass output signal at the third biquadratic circuit output terminals.

19. A circuit as in claim 18, further comprising a boost circuit coupled to receive the lowpass output signal and the bandpass output signal, the boost circuit producing a boost signal.

20. A circuit as in claim 19, wherein a transfer function at the boost output signal includes at least one zero more than a transfer function at the lowpass output signal.

* * * * *